(12) United States Patent
Seki et al.

(10) Patent No.: US 6,613,987 B2
(45) Date of Patent: *Sep. 2, 2003

(54) INSULATING RESIN COMPOSITION FOR MULTILAYER PRINTED-WIRING BOARD

(75) Inventors: Yasuaki Seki, Yokohama (JP); Takashi Ito, Yokohama (JP); Shuji Mochizuki, Yokohama (JP); Kiyonori Furuta, Kawasaki (JP); Toshihiko Hatajima, Kawasaki (JP)

(73) Assignee: Ajinomoto Co., Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/539,864

(22) Filed: Mar. 31, 2000

(65) Prior Publication Data

US 2003/0007332 A1 Jan. 9, 2003

(30) Foreign Application Priority Data

Apr. 1, 1999 (JP) ............................................. 11-095470

(51) Int. Cl.⁷ ................................................. H05K 1/00
(52) U.S. Cl. ........................ 174/258; 174/255; 174/256; 174/259; 361/746; 361/792; 29/846; 29/852; 216/67; 428/901
(58) Field of Search ................................ 174/258, 256, 174/259, 250, 261, 257, 255; 428/209, 901, 416, 418; 361/746, 748, 792, 793, 794, 745, 803; 29/846, 830, 852; 216/67, 72

(56) References Cited

U.S. PATENT DOCUMENTS

| 3,873,637 A | * | 3/1975 | Fujiwara et al. ............. 260/830 |
| 4,386,175 A | | 5/1983 | Kuramachi et al. |
| 4,615,763 A | | 10/1986 | Gelorme et al. |
| 4,933,228 A | * | 6/1990 | Katagiri et al. ............. 428/209 |

(List continued on next page.)

FOREIGN PATENT DOCUMENTS

| EP | 0 434 311 | 6/1991 |
| EP | 0 844 272 | 5/1998 |

OTHER PUBLICATIONS

Derwent Publications, AN 1986–158528, JP 61 090494, May 8, 1996.

Patent Abstracts of Japan, vol. 1996, No. 03, Mar. 29, 1996, JP 7 304933, Nov. 21, 1995.

*Primary Examiner*—David L. Talbott
*Assistant Examiner*—J B Patel
(74) *Attorney, Agent, or Firm*—Oblon, Spivak, McClelland, Maier & Neustadt, P.C.

(57) ABSTRACT

Herein is disclosed an insulating resin composition for a multilayer printed-wiring board, comprising two or more kinds of resins which are different in etching rate by plasma treatment and which are not compatible with each other, so that the surface of the resulting insulating layer can be made uneven by the plasma treatment, whereby the bonding strength of the conductor layer to the said resulting insulating layer can be ensured, and heat resistance and electrically insulating properties required can be satisfied.

14 Claims, 2 Drawing Sheets

U.S. PATENT DOCUMENTS

| | | | |
|---|---|---|---|
| 4,943,606 A | * 7/1990 | Inoue et al. | 523/457 |
| 5,055,321 A | * 10/1991 | Enomoto et al. | 427/96 |
| 5,246,782 A | * 9/1993 | Kennedy et al. | 428/421 |
| 5,517,758 A | * 5/1996 | Nakamura | 174/266 |
| 5,589,250 A | 12/1996 | Asai et al. | |
| 5,726,219 A | * 3/1998 | Hosomi et al. | 522/92 |
| 5,827,604 A | * 10/1998 | Uno et al. | 428/209 |
| 5,830,563 A | * 11/1998 | Shimoto et al. | 428/209 |
| 5,959,256 A | * 9/1999 | Saida et al. | 174/258 |
| 6,010,768 A | * 1/2000 | Yasue et al. | 174/255 |
| 6,033,765 A | * 3/2000 | Takahashi et al. | 428/209 |
| 6,040,068 A | * 3/2000 | Yasumoto et al. | 428/688 |
| 6,042,929 A | * 3/2000 | Burke et al. | 428/141 |
| 6,121,553 A | * 9/2000 | Shinada et al. | 174/259 |
| 6,127,633 A | * 10/2000 | Kinoshita | 174/255 |
| 6,133,377 A | * 10/2000 | Nakamura et al. | 525/109 |
| 6,197,425 B1 | * 3/2001 | Sekimoto et al. | 428/416 |
| 6,212,769 B1 | * 4/2001 | Boyko et al. | 29/846 |
| 6,303,230 B1 | * 10/2001 | Watanabe et al. | 428/458 |
| 6,432,541 B1 | * 8/2002 | Gan | 156/307.3 |

* cited by examiner

INSULATING RESIN COMPOSITION FOR MULTILAYER PRINTED-WIRING BOARD

BACKGROUND OF THE INVENTION

1. Technical Field of the Invention

The present invention relates to an insulating resin composition for a multilayer printed-wiring board where conductor layer(s) and insulating layer(s) are alternately laminated one insulating layer after another conductor layer, more particularly to an insulating resin composition which is to be used to form insulating layer(s) of such multilayer printed-wiring board, the resulting insulating layer(s) from which have excellent adhesive properties to the conductor layer(s), high heat resistance and high insulation reliability.

2. Prior Art

In recent years, in accordance with the progress of the reduction and high performance of electronic appliances, the development of printed-wiring board having a high density and a multilayer structure has rapidly proceeded. However, in accordance with the conventional production process in which such multilayer structure is formed by performing the laminating press of a circuit board having a circuit formed, a prepreg and a copper foil, and the connection between the layers is done by a through-hole, the degree of freedom of the circuit design is decreased due to the formation of the through-hole and it becomes difficult to achieve high density. Furthermore, it is required to perform plating the inside of the through-hole, and therefore, the thickness of the conductor becomes large, which is, in turn, disadvantageous for the fine pattern formation.

As a method for solving such problems, recently, attention is being attracted to a manufacturing technique for multilayer printed-wiring boards in a build-up mode, in which an organic insulating layer is laminated on the conductor layer of the circuit board, then followed by laminating conductor layers and organic insulating layers alternately one organic insulating after another conductor layer. For example, in Japanese Patent Application Laid-Open (Kokai) Nos. 7-304931 and 7-304933, there are disclosed methods for producing a multilayer printed-wiring board, according to which an epoxy resin composition is applied onto the circuit board on which a circuit has been formed, and subjected to heat curing, and then, an unevenly roughened surface is formed with a rough surface-forming agent (i.e., surface-roughening agent), and a conductor layer is formed on this roughened surface by plating. Further, in Japanese Patent Application Laid-Open (Kokai) No. 8-64960, there is disclosed a method for producing a multilayer printed-wiring board, according to which a primer adhesive is applied and provisionally dried, a film-form additive adhesive is then laminated thereon, followed by subjecting to heat curing, rough surface formation is conducted by an alkaline oxidant, and then, a conductor layer is formed on the surface by plating. In these cases, the method of making uneven or rough the surface of the insulating layer for the purpose of ensuring a satisfactory bonding strength between the conductor layer and the resin insulating layer is performed by a wet treatment, according to which a resin layer containing a component which can be decomposed by, or dissolved in, a rough surface-forming agent, such as an oxidant including potassium permanganate or the like, an alkali, or an organic solvent, is contacted with a rough surface-forming liquid (i.e., rough surface-forming agent or surface-roughening agent) by a wet treatment, such as immersion, spraying or the like.

Here, an ordinary conventional production method of a multilayer printed-wring board will be briefly explained.

Figure 2A:
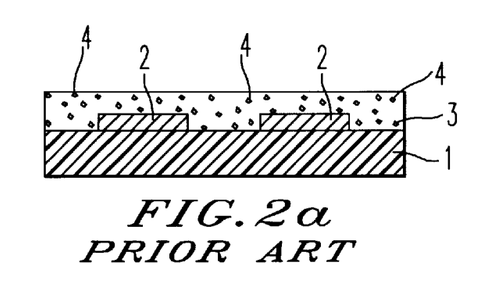

First, as shown in FIG. 2(A), on the surface of insulating core material 1 made of, for example, a glass epoxy resin or the like, a predetermined wiring pattern 2 is formed with the use of copper foil or the like, and onto the entire surface of this core material 1, an insulating layer 3 is application-formed by a method such as screen printing or the like. The major material of the materials for this insulating layer 3 is composed of an epoxy resin, and in the resin of this insulating layer 3, filler 4 is mixed in an appropriate amount to be dissolved in the below-deseribed rough surface formation step.

Figure 2B:
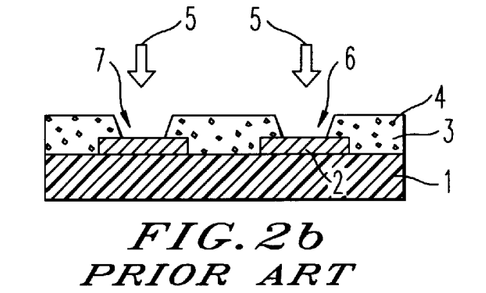
Figure 2C:
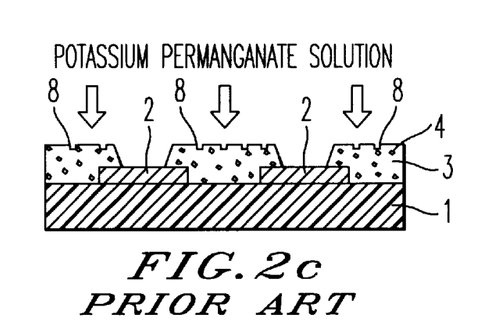

Next, as shown in FIG. 2(B), holes for connection 6 are selectively formed at predetermined positions using, for example, a carbon dioxide gas laser 5 so that the holes penetrates the above-mentioned insulating layer 3, whereby the internal wiring pattern 2 is exposed, 7 indicating the roughened surface of the wiring pattern. Then, as shown in FIG. 2(C), the surface of the above-mentioned insulating layer 3 is affected with an alkaline rough surface-forming chemical liquid, for example, potassium permanganate or the like, so that the above-mentioned filler 4 which is soluble in the above rough surface-forming chemical liquid is dissolved whereby a number of uneven portions 8 are formed, thus effecting the rough surface formation on the insulating layer 3.

Figure 2D:
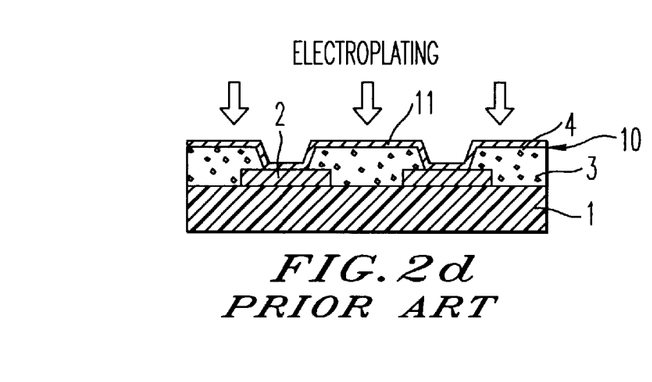
Figure 2E:
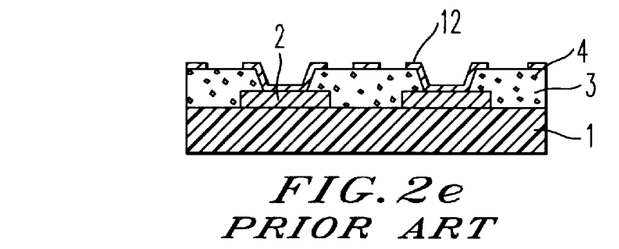

Then, by performing electroless plating and subsequently electroplating, as shown in FIG. 2(D), a conductor layer for electroplating 10 composed of, for example, copper or the like and a conductor layer 11 are subsequently formed. Thus, conduction between the conductor layer 11 and the wring pattern 2 which is the ground work can be made. Further, this conductor layer 11 is subjected to etching to obtain a second layer wring pattern 12.

In an ordinary process, subsequently, another insulating layer is formed, followed by conducting another wiring-patterning, and the above-mentioned steps are repeated, to thereby produce a multilayer printed-wiring board.

By the way, in this type of a wet treatment, it is necessary to perform a satisfactory bath control, with respect to the ion concentration and the pH of the rough surface-forming liquid, the bath temperature and the like, and hence, not only is the operation very cumbersome, but also there has been a problem about the waste liquid due to the life of bath.

Further, with the line width and the width between the lines being reduced, filler 4 having a still smaller particle diameter is demanded; however, the filler 4 can only be reduced in particle diameter to about 10 $\mu$m at the smallest, and if one or five minutes of processing is performed in such a state, a problem also arises that the bonding strength between the insulating layer and the conductor layer is lowered.

Furthermore, even if it is possible to obtain a filler 4 having a still smaller particle diameter, there is also a problem that in the electroless plating conducted in a subsequent-step, the treatment liquid is difficult to enter.

SUMMARY OF THE INVENTION

Problems to be Solved by the Invention

The present invention has been made for solving the above-mentioned problems effectively, and it is an object to provide an insulating resin composition for a multilayer printed-wiring board, which can ensure the bonding strength of a conductor layer with an insulating layer by performing a rough surface formation by a dry treatment, such as plasma or sputtering or the like, without performing a wet treatment which has conventionally been conducted for the rough surface formation, and can satisfy heat resistance and electrically insulating properties.

Means to Solve the Problems

The present inventors have conducted made extensive and intensive studies with a view to solving the above-mentioned problems. As a result, it has been found that the below-described resin composition has extremely excellent performance, on the basis of which the present invention has been completed.

Specifically, the present invention relates to an insulating resin composition for a multilayer printed-wiring board which composition is to be used to form, or as, an insulating layer of the multilayer printed-wiring board, wherein for obtaining a roughness or unevenness by plasma treatment on the surface of the, insulating layer resulting from the insulating resin composition, the said insulating resin composition comprises two or more kinds of resins which are different in etching rate by a plasma treatment and which are not compatible with each other.

Thus, it has become possible to perform fine roughness formation treatment on the surface of the insulating layer by a dry treatment, such as a plasma treatment or the like. In this case, it is preferred that a surface roughness degree of the above-mentioned insulating layer by the plasma treatment is adjusted so as to be in the range of 100 to 4,000 nm.

BRIEF DESCRIPTION OF THE DRAWINGS

FIG. 1 is a figure showing the production process of the printed-wiring board, with the use of the insulating resin composition of the present invention, wherein 13: Core material; 14: Wiring pattern; 15: Insulating layer (Insulating resin composition); 19: Ground conductor layer for electroplating; and 20: Conductor layer.

FIG. 2 is a figure showing the conventional production process of the printed-wiring board.

DETAILED DESCRIPTION OF THE INVENTION

Hereinbelow, the insulating resin composition for a multilayer printed-wiring board according to the present invention and the insulating layer formed from such insulating resin compositon, will be described in detail based on the attached drawings.

First, the insulating resin composition of the present invention which is to be used for, or to form, an insulating layer of a multilayer printed-wiring board, is characterized in that for obtaining a roughness or unevenness on the surface of the above-mentioned insulating layer by plasma treatment, the said insulating resin composition comprises two or more kinds of resins which are different in etching rate of the plasma treatment and which are not compatible with each other.

In order for an insulating layer resulting from the insulating resin composition to have an unevenness on the surface thereof by a plasma treatment in an oxygen and/or argon atmosphere, the insulating resin composition, as mentioned above, comprises at least two kinds of resins, and it is necessary to simultaneously satisfy two requirements that the resin are different in etching rate between them; and that the resins are not compatible with each other. That is, in the case where only one of the two above-mentioned requirements is satisfied, even when a plasma treatment is conducted, a roughness is merely uniformly formed on the surface, and hence, a desired unevenness is not obtained.

Further, for ensuring a satisfactory bonding strength of the insulating layer to the conductor layer, it is desired that a roughness degree of the surface unevenness obtained by plasma treatment is in the range of 100 to 4,000 nm. The surface roughness by the plasma treatment can be controlled by adjusting the plasma treatment time if the resins have different etching rates.

The ability to form a rough surface by plasma treatment also varies depending on the electric power density, the pressure, and the form and function of the apparatus, and thus, for obtaining a desired roughness, it is necessary to appropriately select a treatment time. When the surface roughness degree is less than 100 nm, a satisfactory bonding strength cannot be obtained. On the other hand, when the surface roughness degree is more than 4,000 nm, it becomes difficult to form a fine pattern.

The surface roughness degree according to the present invention is represented by, for example, ten-point average roughness (Rz). The measurement of the surface roughness was conducted using a non-contact three-dimensional measurement apparatus "NH-3", manufactured and sold by Mitakakohki Co., Ltd.

Here, the production method for a multilayer printed-wiring board using the above-mentioned insulating resin composition to form, or for, an insulating layer will be briefly explained.

Figure 1A:
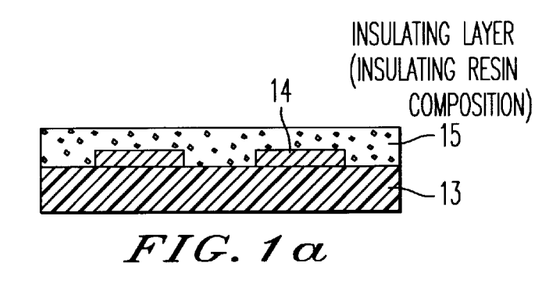

First, as shown in FIG. 1(A), on the surface of insulating core material 13 made of, for example, a glass epoxy resin or the like, a predetermined wiring pattern 14 is formed with the use of copper foil or the like, and onto the entire surface of this core material 13, an insulating layer 15 made from the insulating resin composition of the present invention is application-formed by a method such as screen printing or the like. For this insulating layer 13, a mixed composition of the above-described two or more kinds of organic resins having different dry etching rates is used. The major material for this insulating layer 15 is a mixed composition of, for example, an epoxy resin and, for example, a polyimide resin or the like having a dry etching rate which is relatively higher than that of the epoxy resin. In this insulating layer 15, such a filler is not contained as the above-described surface roughening component.

Figure 1B:
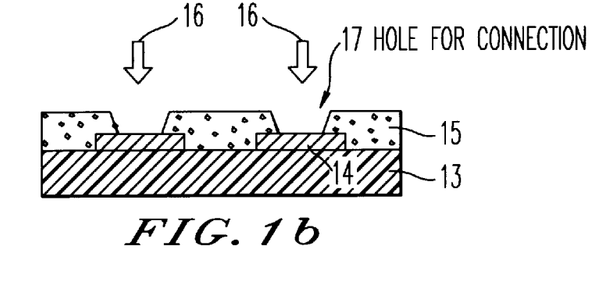
Figure 1C:
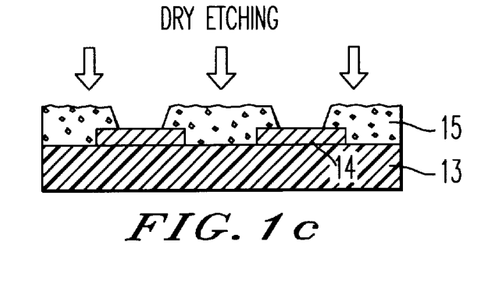

Next, as shown in FIG. 1(B), at the electrical connection portion, holes for connection 17 are selectively formed using, for example, YAG laser beam 16 so that the holes penetrate the above-mentioned insulating layer 15, whereby the internal wiring pattern 14 is exposed.

Figure 1D:
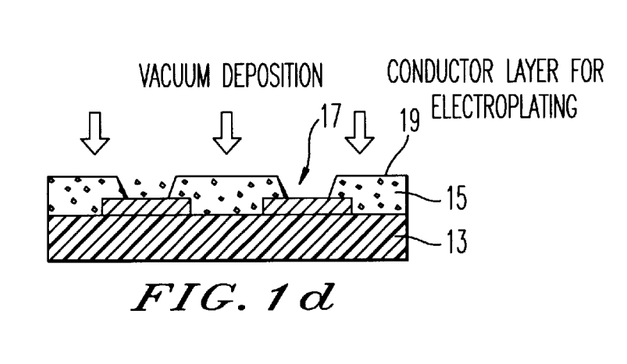

Then, the whole of this core material is introduced into a dry etching apparatus and subjected to dry etching as shown in FIG. 1(C). By this dry etching, on the entire surface of the resin constituting the insulating layer 15, the slight thickness of the surface of the resin having a high etching rate is selectively etched and removed. In this case, the portions of the resin having a lower etching rate are not removed by etching and remain as convex portions, and as a result, a uniform unevenness appears on the entire surface, thus achieving a rough surface formation.

The etching treatment according to the present invention can be conducted using an ordinary RIE (reactive ion etching) apparatus or the like, and as an etching gas for the dry etching, an inert gas such as argon gas or the like, can be used. Then, the whole of the core material is introduced into a sputtering apparatus where a vacuum deposition method is employed, and subjected to sputtering deposition, so that, as shown in FIG. 1(D), a conductor layer for electroplating 19 is formed on the entire of the surface of the insulating layer 15 and the inner wall surface of the holes for connection 17.

Figure 1E:
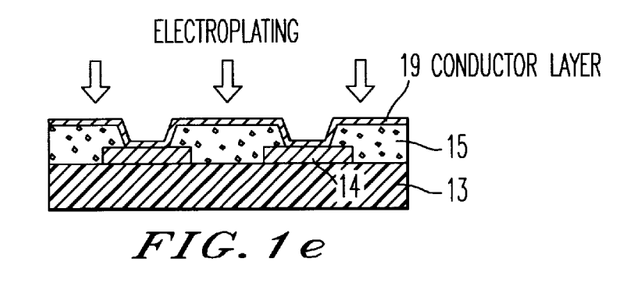
Figure 1F:
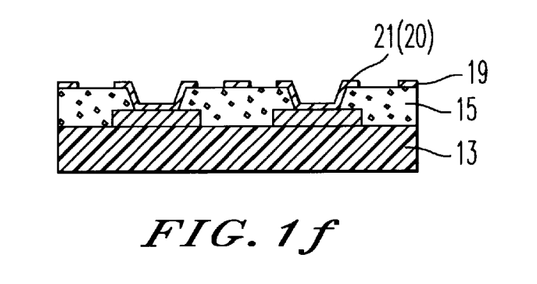

Then, as shown in FIG. 1(E), on the above-mentioned conductor layer for electroplating 19, a conductor layer 20 composed of, for example, copper is formed by electroplating. Thus, conduction between the above-mentioned conductor layer 20 and a wring pattern 14 which is the lower layer can be made. Further, as shown in FIG. 1(F), this conductor layer 20 is subjected to etching to form a second wring pattern 21. In an ordinary process, on the surface of this second wring pattern 21, an insulating layer is formed, followed by patterning a wiring again, and the above-mentioned steps are repeated, to thereby produce a multi-layer printed-wiring board (built-up substrate).

As mentioned above, by using the insulating resin composition of the present invention, a ground conductor layer for electroplating can be formed by the vacuum deposition instead of the wet electroless plating which has been conventionally used, and it is also possible to prevent the conduction failure which has been caused by the fact that the conventional electroless plating treatment liquid is difficult to enter into holes in accordance with the reduction of the hole size.

Hereinbelow, the insulating resin composition used for the above-mentioned insulating layer 15 will be explained in detail.

The insulating resin composition of the present invention is characterized in that the ingredient resins are different in etching rate in the plasma treatment in an oxygen and/or argon atmosphere, and the resins are not compatible with each other, but there are no other particular limitations as long as they have properties required as interlayer insulating material, such as electrical properties, heat resistance and the like. As these resins, there can be mentioned a polyimide resin, an epoxy resin, a cyanate ester resin, a polyether sulfone resin, a polyphenylene ether resin, a diallyl phtharate resin, a polyurethane resin, a polyester resin, a phenolic resin, a phenoxy resin, and additionally, compounds obtained by homopolymerizing, or copolymerizing two or more kinds of compounds having a double bond, such as butadiene, acrylonitrile, styrene, (meth)acrylate and the like, a rubber compound and the like. Of these, from the viewpoint of achieving high heat resistance and excellent electrical properties such as low dielectric constant and the like, it is preferred that a polyimide resin, an epoxy resin, a cyanate ester resin, a polyphenylene ether resin or a polyether sulfone resin is used as a matrix resin, and that a resin which is incompatible with these resins and has a different etching rate by the plasma treatment is used in combination therewith.

As types of the above-mentioned polyimide resins, there can be mentioned a condensation type thermoplastic polyimide, a thermosetting polyimide, a polyamide-imide and the like, but it is preferred that the polyimide resin is soluble in a solvent. As the above-mentioned condensation type thermoplastic polyimide, there can be used for example, a polycondensation reaction product of an acid anhydride with a polyamine where a flexible structure (—O—, —SO$_2$—, or the like) has been introduced into the main chain thereof or a bulky group has been introduced into the side chain thereof for improving the solubility, and the like. As specific examples of such polyimides, there can be mentioned "Ultem", manufactured and sold by GE Plastics Co., Ltd., "RIKACOAT", manufactured and sold by New Japan Chemicals Co., Ltd., "Matriimide", manufactured and sold by Asahi-CIBA Limited, and the like, and further, a polyamide acid which is a precursor of these thermoplastic polyimides, for example, "Torenees", manufactured and sold by Toray Industries Inc., "LARC-TPI", manufactured and sold by Mitsui Chemicals Co., Ltd., and the like, can be used.

Further, the above-mentioned thermosetting polyimide is a reactive oligoimide having a crosslinking site, such as nadic, acetylene, allyl, biphenylene, a furan ring, maleimide or the like, and specific examples thereof include "BMI-S", "BMI-M-20", "BMI-PP", "BMI-TDA" and "BMI-MP", which are manufactured and sold by Mitsui Chemicals Co., Ltd.; "VB-1 resin", manufactured and sold by Showa High-polymers Co., Ltd.; "BMI-H", "BMI-80" and "BMI-70", which are manufactured and sold by K•I Chemicals Industry Co., Ltd.; "Kelimide", manufactured and sold by Asahi-CIBA Limited; "BANI", manufactured and sold by Maruzen Petrochemical Co., Ltd.; and the like. Further, when the above-mentioned thermosetting polyimide is used, a compound having a reactive group which reacts on the crosslinking site, such as amine, a diene or the like, can be used together therewith.

And, as the above-mentioned polyamide-imide, there can be mentioned "Torlon", manufactured and sold by Teijin Amoco Engineering Plastics Limited, and the like.

Specific examples of the above-mentioned epoxy resins to be used according to the present invention include a bisphenol A type epoxy resin, a bisphenol F type epoxy resin, a bisphenol S type epoxy resin, a phenol-novolak type epoxy resin, an alkylphenol-novolak type epoxy resin, a naphthalene type epoxy resin, a dicyclopentadiene type epoxy resin, an epoxide which is a condensation product of a phenol with an aromatic aldehyde having a phenolic hydroxyl group, a alicyclic epoxy resin, and the above-mentioned epoxy resins which are brominated, and the like, and it is preferred that these are in a liquid form or soluble in a solvent. Further, for improving the heat resistance and electrical properties, a solid epoxy resin, such as a bisphenol type epoxy resin, triglycidyl isocyanurate or the like, can be pulverized and dispersed in the resin composition of the present invention. Further, a monofunctional epoxy resin as a reactive diluent may be contained.

When the above-mentioned epoxy compound is used, it is preferred that a curing agent for an epoxy resin is used in combination therewith. If the epoxy resin curing agent is not used, the resin may remain uncured or the curing requires a high temperature or a long time. Specific examples of such epoxy resin curing agents include imidazole and/or a derivative thereof, a polyamine, an organic acid salt and/or an epoxy adduct of a polyaminie, a tertiary amine, an ammonium salt, a phosphine, a phosphonium salt, a photo-cationic polymerization catalyst, and the like.

This epoxy resin curing agent is preferably used in an amount of 0.01 to 25 parts by weight, especially preferably in an amount of 0.1 to 15 parts by weight, relative to 100 parts by weight of the above epoxy compound. If it is used in an amount of less than 0.01 part by weight, the epoxy resin may remain uncured or the curing requires a high temperature or a long time. On the other hand, if it is used in an amount of more than 25 parts by weight, a problem about the storage stability of the resin composition arises or the properties of the cured product become poor.

Specific examples of the above-mentioned cyanate ester resins to be used according to the present invention include bisphenol A dicyanate and/or a prepolymer thereof, tetramethylbisphenol A dicyanate and/or a prepolymer thereof, hexafluorobisphenol A dicyanate and/or a prepolymer thereof, bisphenol AD dicyanate and/or a prepolymer thereof, bisphenol S cyanate and/or a prepolymer thereof, phenol-novolak type cyanate ester, and the like.

When the above-mentioned cyanate ester resin is used, it is preferred that a curing catalyst is used in combination therewith. If a curing catalyst is not used, the resin may remain uncured or the curing requires a high temperature or a long time. As specific examples of the curing catalysts, there can be mentioned a salt or a chelate by acetyl acetone or the like, of a transition metal, such as copper, lead, tin, manganese, nickel, iron, zinc, cobalt or the like, and a carboxylic acid, such as octylic acid, naphthenic acid or the like.

The curing agent for the above-mentioned cyanate ester resin is preferably used in an amount of 10 to 2,000 ppm, especially preferably in an amount of 50 to 600 ppm, based on the weight of the above cyanate ester resin. If it is used in an amount of less than 10 ppm, the resin may remain uncured or the curing requires a high temperature or a long time. On the other hand, if it is used in an amount of more than 2,000 ppm, a problem about the storage stability of the resin composition arises or the properties of the cured product become poor.

The unevenness formed by plasma treatment on the surface of the insulating resin layer varies in form depending not only on the types of the resins used in the insulating resin composition of the present invention but also the mixing ratio of the resins. Therefore, it is necessary to appropriately adjust the mixing ratio so as to obtain a desired form, taking into consideration the degree of the phase separation and the etching rates of the resins combined.

In the insulating resin composition of the present invention, if necessary, an organic solvent can be incorporated. Representative examples of organic solvents include N,N-dimethylformamide; N,N-dimethylacetamide; N-methyl-2-pyrrolidone; a ketone, such as methyl ethyl ketone, cyclohexanone, or the like; an ester, such as ethyl acetate, butyl acetate, cellosolve acetate, propylene glycol monomethyl ether acetate, carbitol acetate, or the like; a glycol ether, such as methyl cellosolve, butyl cellosolve, methyl carbitol, butyl carbitol, propylene glycol monomethyl ether, diethylene glycol dimethyl ether, triethylene glycol dimethyl ether, or the like; an aromatic hydrocarbon, such as toluene, xylene, tetramethylbenzene, or the like; and the like, and these can be used individually or in combination of two or more thereof.

Further, in the insulating resin composition of the present invention, in addition to the above-mentioned components, a known additive can be incoporated. For example, there can be used an additive including an inorganic filler, such as barium sulfate, barium titanate, a silicon oxide powder, amorphous silica, talc, clay, a mica powder, or the like; an organic filler, such as a silicone powder, a nylon powder, a fluoride powder, or the like; a thickener, such as asbestos, orben, benton, or the like; a silicone-based, fluoride-based or polymer-based defoamer and/or leveling agent; and a bond-imparting agent, such as an imidazol, thiazol, triazol or silane coupling agent, or the like. Further, if necessary, there can be used a known coloring agent, such as phthalocyanine blue, phthalocyanine green, iodine green, disazo yellow, titanium oxide, carbon black, or the like. With respect to the inorganic component, by limiting the amount to 50% by weight or less, preferably 30% by weight or less, based on the resin composition, an insulating layer exhibiting an excellent laser processability can be formed. If the amount of the inorganic component is more than 50% by weight, it becomes difficult to perform processing of a small diameter via-hole of 100 $\mu$m or less in a good form, and there may also occur problems about productivity, such as the connection reliability and laser processing rate being lowered due to the failure of plating tightly, and the like.

In the production of a multilayer printed-wiring board, as a method for laminating the insulating resin composition of the present invention on the conductor layer of the wiring board on which a circuit has been formed, there can be mentioned known methods, such as a screen printing method, a roll coating method, a flood coating method, a spray coating method, and the like. When an organic solvent is contained, drying is performed after coating, followed by heat curing. It is preferred that the drying conditions are such that the temperature is 70–130° C. and the time is 5–40 minutes and the heat curing conditions are such that the temperature is 130–250° C. and the time is 15–120 minutes. Further, by processing the insulating resin composition of the present invention into a film, the resin composition can also be laminated on the circuit substrate on which a circuit has been formed by laminating or press under pressurizing and heating conditions.

EXAMPLES

Hereinbelow, the present invention will be described in more detail with reference to the following Examples, but the present invention is not limited thereto.

Example 1

70 Parts by weight of a thermoplastic polyimide resin ("Ultem", manufactured and sold by GE Plastics Co., Ltd.) and 30 parts by weight of a bisphenol A type epoxy resin ("EP1001", manufactured and sold by Yuka Shell Epoxy Kabushiki Kaisha) were dissolved in N-methyl-2-pyrrolidone (hereinafter, referred to as "NMP") with stirring, and 0.9 parts by weight of 2-ethyl-4-methylimidazol ("2E4MZ", manufactured and sold by Shikoku Chemicals Corporation) as the curing catalyst for the epoxy resin was added thereto, whereby an insulating resin composition was prepared. This insulating resin composition was applied by bar coat printing onto a substrate on which a circuit has been previously formed, and subjected to predrying at 80° C. for 30 minutes, followed by heat curing at 150° C. for 1 hour. The cured product of the above insulating resin composition was subjected to a rough surface-forming treatment by an argon plasma at an argon partial pressure of 0.05 Torr at an RF electric power of 200 W for 4 minutes, and then, a thin copper film layer was formed by means of a sputtering machine. Then, on the resultant thin copper film, an electroplating of copper was conducted to form a conductor layer having a copper thickness of 20 $\mu$m, whereby a sample was prepared.

Example 2

65 Parts by weight of a thermoplastic polyimide resin ("SN-20", manufactured and sold by New Japan Chemicals Co., Ltd.) and 35 parts by weight of a bisphenol A type epoxy resin ("EP1001", manufactured and sold by Yuka Shell Epoxy Kabushiki Kaisha) were dissolved in NMP with stirring, and 0.9 parts by weight of 2-ethyl-4-methylimidazol ("2E4MZ", manufactured and sold by Shikoku Chemicals Corporation) as the curing catalyst for the epoxy resin was added thereto, whereby an insulating resin composition was prepared. The prepared insulating resin composition was treated in the same manner as in Example 1, to thereby prepare a sample.

Example 3

80 Parts by weight of a thermoplastic polyimide resin ("Ultem", manufactured and sold by GE Plastics Co., Ltd.) and 20 parts by weight of a prepolymer of a bisphenol A dicyanate ("B-30", manufactured and sold by CIBA- GEIGY) were dissolved in NMP with stirring, and 0.006 parts by weight of tin octylate as the curing catalyst for the cyanate ester resin was added thereto, whereby an insulating resin composition was prepared. The prepared insulating resin composition was treated in the same manner as in Example 1 except that the heat curing conditions were changed to those such that the temperature was 200° C. and the time was 1 hour, to thereby prepare a sample.

Comparative Example 1

70 Parts by weight of a prepolymer of a bisphenol A dicyanate ("B-30", manufactured and sold by CIBA-GEIGY) and 30 parts by weight of a bisphenol A type epoxy resin ("4EP1001", manufactured and sold by Yuka Shell Epoxy Kabushiki Kaisha) were dissolved in carbitol acetate with stirring, and 0.02 parts by weight of tin octylate as the curing catalyst was added thereto, whereby an insulating resin composition was prepared. The prepared insulating resin composition was treated in the same manner as in Example 1 except that the heat curing conditions were changed to those such that the temperature was 200° C. and the time was 1 hour, to thereby prepare a sample.

Comparative Example 2

30 Parts by weight of a bisphanol A type epoxy resin ("EP1001", manufactured and sold by Yuka Shell Epoxy Kabushiki Kaisha) and 70 parts by weight of a phenoxy resin ("YP-50S", manufactured and sold by Tohto Kasei Co., Ltd.) were dissolved in carbitol acetate with stirring, and 2.1 parts by weight of 2-ethyl-4-methylimidazol ("2E4MZ", manufactured and sold by Shikoku Chemicals Corporation) as the curing catalyst for the epoxy resin was added thereto, whereby an insulating resin composition was prepared. The prepared insulating resin composition was treated in the same manner as in Example 1, to thereby prepare a sample.

With respect to the resins used in the above Examples 1–3 and Comparative Examples 1 and 2, the etching rate of each of the resins in the plasma treatment in an argon atmosphere is shown in Table 1. Further, with respect to the samples prepared by the respective methods in the above examples from the compositions obtained by the selection from, and combination of, these resins, the evaluation results are shown in Table 2.

TABLE 1

| Resin | Etching rate (µm/sec) | Curing and drying conditions | Amount of catalyst added |
|---|---|---|---|
| Ultem | 1.0 | ≠1 | — |
| SN-20 | 0.9 | ≠1 | — |
| EP-1001 | 0.3 | ≠2 | 3% 2E4MZ |
| B-30 | 0.14 | ≠1 | 200 ppm Tin octylate |
| YP-50S | 3.5 | ≠2 | — |

≠1 80° C. for 30 min + 200° C. for 60 min
≠2 80° C. for 30 min + 150° C. for 60 min

TABLE 2

| | Example | | | Com. Example | |
|---|---|---|---|---|---|
| Composition | 1 | 2 | 3 | 1 | 2 |
| Ultem | 70 | | 70 | | |
| SN-20 | | 70 | | | |
| EP-1001 | 30 | 30 | | 70 | 70 |
| B-30 | | | 30 | 30 | |

TABLE 2-continued

| | Example | | | Com. Example | |
|---|---|---|---|---|---|
| Composition | 1 | 2 | 3 | 1 | 2 |
| YP-50S | | | | | 30 |
| 2E4MZ | 0.9 | 0.9 | | | 2.1 |
| Tin octylate | | | 0.006 | 0.02 | |
| Degree of roughness after plasma treatment | ○ | ○ | ○ | X | X |
| Blister after annealing | ○ | ○ | ○ | X | X |
| Peel strength (kg/cm) | 1.2 | 1.0 | 1.0 | Unmeasurable | 0.2 |
| Solder heat resistance (260° C., 30 sec) | ○ | ○ | ○ | X | X |

As is apparent from Examples 1 to 3, when a desired unevenly roughened surface was formed by the plasma treatment, a satisfactorily rough surface formation was achieved according to the SEM photographing, and there were no blisters after the annealing, and an excellent peel strength was obtained, and also in the solder heat resistance test, there was no problem about blisters and the like. As compared therewith, in Comparative Examples 1 and 2, since the selected resins were compatible with each other, even when these were subjected to plasma treatment, a satisfactorily rough surface formation was not achieved, according to the SEM photographing, and thus, a desired roughness was not obtained, and blisters after the annealing and blisters in the solder heat resistance test occurred, and the peel strength was also unsatisfactory.

Effect of the Invention

As mentioned above, according to the insulating resin composition for a multilayer printed-wiring board of the present invention, the following excellent effects can be exhibited.

In the formation of the rough surface on the insulating layer for ensuring a satisfactory bonding force between the conductor layer and the insulating layer, not a wet treatment using an oxidant or the like which has been conventionally conducted but a dry treatment having high productivity, such as a plasma treatment or the like, can be employed. Thus, a stable form of a rough surface can be obtained without the conventional problems about cumbersome bath control and waste liquid treatment, and a high bonding strength can be realized. Further, by using this insulating resin composition, both of high heat resistance and excellent electrical properties can be achieved and a multilayer printed-wiring board having a high wiring density can be produced.

What is claimed is:

1. A method for producing a multilayer printed-wiring board, comprising:
    (1) plasma etching a layer of an insulating resin composition, to obtain a plasma-treated insulating layer; and
    (2) forming a conducting layer on said plasma-treated insulating layer,
    wherein said resin composition comprises a first resin and a second resin, and said first resin and said second resin have different plasma etching rates and said first resin and said second resin are not compatible with each other.

2. The method of claim 1 wherein said insulating layer comprises a resin selected from the group consisting of polyamide resins; epoxy resins; cyanate ester resins; polyether sulfone resins; polyphenylene ether resins; diallyl phthalate resins; polyurethane resins; polyester resins; phenohic resins; phenoxy resins; resins obtained by polynierizing two or more monomers selected from the group consisting of butadiene, acrylonitirle, styrene, and (meth) acrylate; and mixtures thereof.

3. The method of claim 1, wherein said insulating layer comprises an epoxy resin and a polyamide resin.

4. The method of claim 3, wherein said polyamide resin has a plasma etching rate which is higher than the plasma etching rate of said epoxy resin.

5. The method of claim 1, wherein said plasma etching is reactive ion etching and with argon gas as an etching gas.

6. The method of claim 1, wherein said insulating layer is formed on a surface of a substrate and said substrate comprises a wiring pattern on said surface of said substrate.

7. The method of claim 6 further comprising forming holes in said insulating layer to expose a portion of said wiring pattern.

8. A multilayer printed-wiring board, which is prepared by a process comprising:
   (1) plasma etching a layer of an insulating resin composition, to obtain a plasma-treated insulating layer; and
   (2) forming a conducting layer on said plasma-treated insulating layer,
   wherein said resin composition comprises a first resin and a second resin, and said first resin and said second resin have different plasma etching rates and said first resin and said second resin are not compatible with each other.

9. The multilayer printed-wiring board of claim 8, wherein said insulating layer comprises an epoxy resin and a polyamide resin.

10. The multilayer printed-wiring board of claim 9, wherein said polyamide resin has a plasma etching rate which is higher than the plasma etching rate of said epoxy resin.

11. The multilayer printed-wiring board of claim 8, wherein said insulating layer comprises a resin selected from the group consisting of polyamide resins; epoxy resins; cyanate ester resins; polyether sulfone resins; polyphenylene ether resins; diallyl phthalate resins; polyurethane resins; polyester resins; phenolic resins; phenoxy resins; resins obtained by polymerizing two or more monomers selected from the group consisting of butadiene, acrylonitirle, styrene, and (meth)acrylate; and mixtures thereof.

12. The multilayer printed-wiring board of claim 8, wherein said insulating layer is formed on a surface of a substrate and said substrate comprises a wiring pattern on said surface of said substrate.

13. The multilayer printed-wiring board of claim 12, wherein said process further comprises forming holes in said insulating layer to expose a portion of said wiring pattern.

14. The multilayer printed-wiring board of claim 8, wherein said plasma etching is reactive ion etching and with argon gas as an etching gas.

* * * * *

UNITED STATES PATENT AND TRADEMARK OFFICE
CERTIFICATE OF CORRECTION

PATENT NO. : 6,613,987 B2
DATED : September 2, 2003
INVENTOR(S) : Yasuaki Seki et al.

It is certified that error appears in the above-identified patent and that said Letters Patent is hereby corrected as shown below:

Column 2,
Lines 2, 32 and 35, "wring" should read -- wiring --;
Line 12, "deseribed" should read -- described --;

Column 3,
Line 17, "of the," should read -- of the --;
Line 44, "compositon" should read -- composition --.

Column 5,
Lines 5, 8 and 9, "wring" should read -- wiring --.

Column 9,
Line 15, ""4EP1001"," should read -- "EP1001", --.

Column 10,
Line 62, "claim 1" should read -- claim 1, --;
Lines 66-67, "phenohic" should read -- phenolic --;
Line 67, "polynier-" should read -- polymer- --.

Column 11,
Line 2, "acrylonitirle" should read -- acrylonitrile --;
Line 12, "tormed" should read -- formed --.

Column 12,
Line 15, "acrylonitirle" should read -- acrylonitrile --.

Signed and Sealed this

Thirtieth Day of March, 2004

JON W. DUDAS
*Acting Director of the United States Patent and Trademark Office*